(12) United States Patent
Kanematsu

(10) Patent No.: US 10,868,564 B1
(45) Date of Patent: Dec. 15, 2020

(54) METHODS AND APPARATUS FOR A DELTA-SIGMA ANALOG-TO-DIGITAL CONVERTER

(71) Applicant: SEMICONDUCTOR COMPONENTS INDUSTRIES, LLC, Phoenix, AZ (US)

(72) Inventor: Masayuki Kanematsu, Hashima (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/788,483

(22) Filed: Feb. 12, 2020

(51) Int. Cl.
*H03M 3/00* (2006.01)
*H03M 1/12* (2006.01)

(52) U.S. Cl.
CPC .......... *H03M 3/496* (2013.01); *H03M 3/464* (2013.01); *H03M 1/1245* (2013.01); *H03M 3/458* (2013.01)

(58) Field of Classification Search
CPC ...... H03M 3/496; H03M 3/464; H03M 3/458; H03M 1/1245
USPC .......................................... 341/122, 143, 155
See application file for complete search history.

(56) References Cited

U.S. PATENT DOCUMENTS

| | | | |
|---|---|---|---|
| 10,790,851 B2 * | 9/2020 | Nezuka | ................ H03M 3/456 |
| 2013/0191446 A1 | 7/2013 | Ro et al. | |
| 2016/0197619 A1 | 7/2016 | Katayama | |

* cited by examiner

*Primary Examiner* — Khai M Nguyen
(74) *Attorney, Agent, or Firm* — The Noblitt Group, PLLC; Hettie L. Haines

(57) ABSTRACT

Various embodiments of the present technology may provide methods and apparatus for a delta-sigma analog-to-digital converter. The delta-sigma ADC may provide a sample-and-hold circuit defined by a first switch, a second switch, a capacitor, and an amplifier, and an integrator defined by the first capacitor, a second capacitor, and the amplifier, wherein the sample-and-hold circuit and the integrator share the first capacitor and the amplifier.

20 Claims, 4 Drawing Sheets

US 10,868,564 B1

METHODS AND APPARATUS FOR A DELTA-SIGMA ANALOG-TO-DIGITAL CONVERTER

BACKGROUND OF THE TECHNOLOGY

Analog-to-digital converters (ADCs) are utilized in a variety of electronic devices and systems to transform an analog signal to a digital signal. One ADC architecture commonly used is the delta-sigma type ADC. The delta-sigma ADC typically provides a sample-and-hold circuit as a first input stage. The sample-and-hold circuit occupies a large area on the ADC chip.

SUMMARY OF THE INVENTION

Various embodiments of the present technology may provide methods and apparatus for a delta-sigma analog-to-digital converter. The delta-sigma ADC may provide a sample-and-hold circuit defined by a first switch, a second switch, a capacitor, and an amplifier, and an integrator defined by the first capacitor, a second capacitor, and the amplifier, wherein the sample-and-hold circuit and the integrator share the first capacitor and the amplifier.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various amplifiers, signal converters, switches, and semiconductor devices, such as transistors, capacitors, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology.

Methods and apparatus for a delta-sigma analog-to-digital converter (ADC) 100 according to various aspects of the present technology may operate in conjunction with any suitable electronic system, such as an imaging system, an audio system, and the like.

Figure 1:
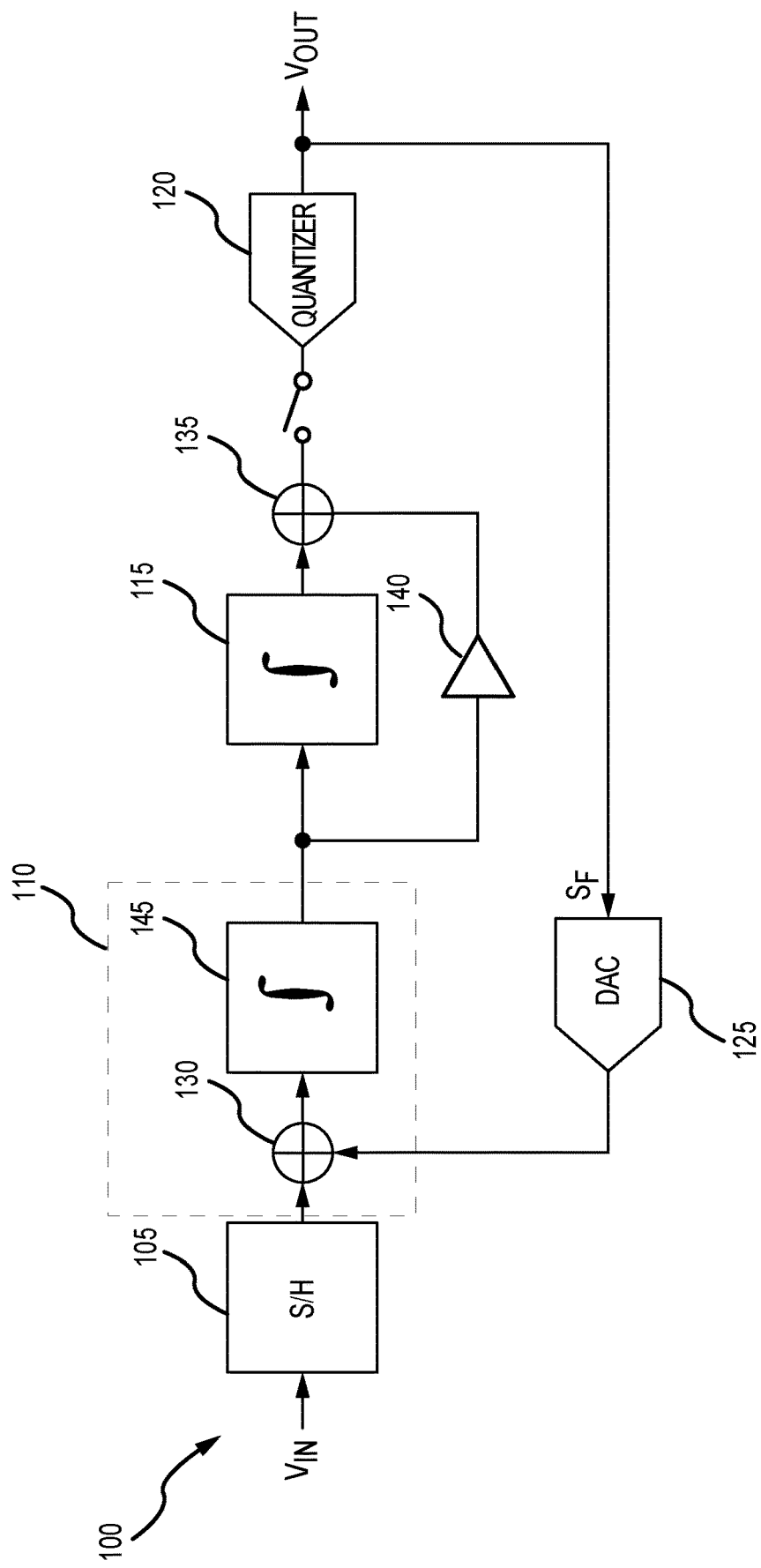
FIG. 1 is a block diagram of an incremental delta-sigma ADC in accordance with an exemplary embodiment of the present technology.

Referring to FIG. 1, the delta-sigma ADC 100 may be configured as a continuous-time incremental delta-sigma ADC to convert an analog input signal $V_{IN}$ into a digital output signal $V_{OUT}$. The analog input signal $V_{IN}$ may be a continuously varying signal. In an exemplary embodiment, the delta-sigma ADC may comprise a sample-and-hold circuit 105, a first integrator 110, a second integrator 115, a first signal converter 120, and a second signal converter 125.

The sample-and-hold circuit 105 may be configured to receive and sample the input signal $V_{IN}$ and hold (lock) the sampled value at a constant level for a specified period of time. In an exemplary embodiment, and referring to FIG. 2, the sample-and-hold circuit 105 may comprise a first switch 225 directly connected to an input terminal 245, where the input terminal 245 receives the input signal $V_{IN}$. The first switch 225 may comprise any circuit and/or device suitable for connecting and disconnecting the input terminal 245 from the remaining delta-sigma ADC 100. For example, the first switch 225 may comprise a transistor responsive to a control signal (not shown).

The sample-and-hold circuit 105 may further comprise a first capacitor 210 comprising a first plate and a second plate. The first capacitor 201 may be connected to the first switch 225, wherein in the first switch 225 is connected between the input terminal 245 and the first plate of the first capacitor 210.

The sample-and-hold circuit 105 may further comprise a second switch 230 directly connected to the second plate of the first capacitor 210. The second switch 230 may comprise any circuit and/or device suitable for connecting and disconnecting a conducting path connected to the second plate of the first capacitor 210.

The sample-and-hold circuit 105 may further comprise an amplifier 200. The amplifier 200 may comprise an input terminal connected to the second plate of the first capacitor 210, and an output terminal connected to the second integrator 115 and a buffer 140. The amplifier 200 may comprise any circuit and/or device suitable for amplifying the input signal $V_{IN}$. In one embodiment, and referring to FIG. 4, the amplifier 200 may be configured as an inverting amplifier comprising a PMOS transistor 410 connected in series with an NMOS transistor 415, wherein gates of each transistor is connected to the second plate of the first capacitor 210, and a source terminal of the PMOS transistor 410 is connected to a supply voltage $V_{DD}$. A source terminal of the NMOS transistor 415 may be connected to a reference voltage $V_{SS}$. In the present case, a node between the PMOS transistor 410 and NMOS transistor 415 provides the output terminal of the amplifier 200. In an exemplary embodiment, the second switch 230 may be connected in parallel with the amplifier—in other words, the second switch 230 may be connected to both the input and output terminals of the amplifier 200.

Figure 2:
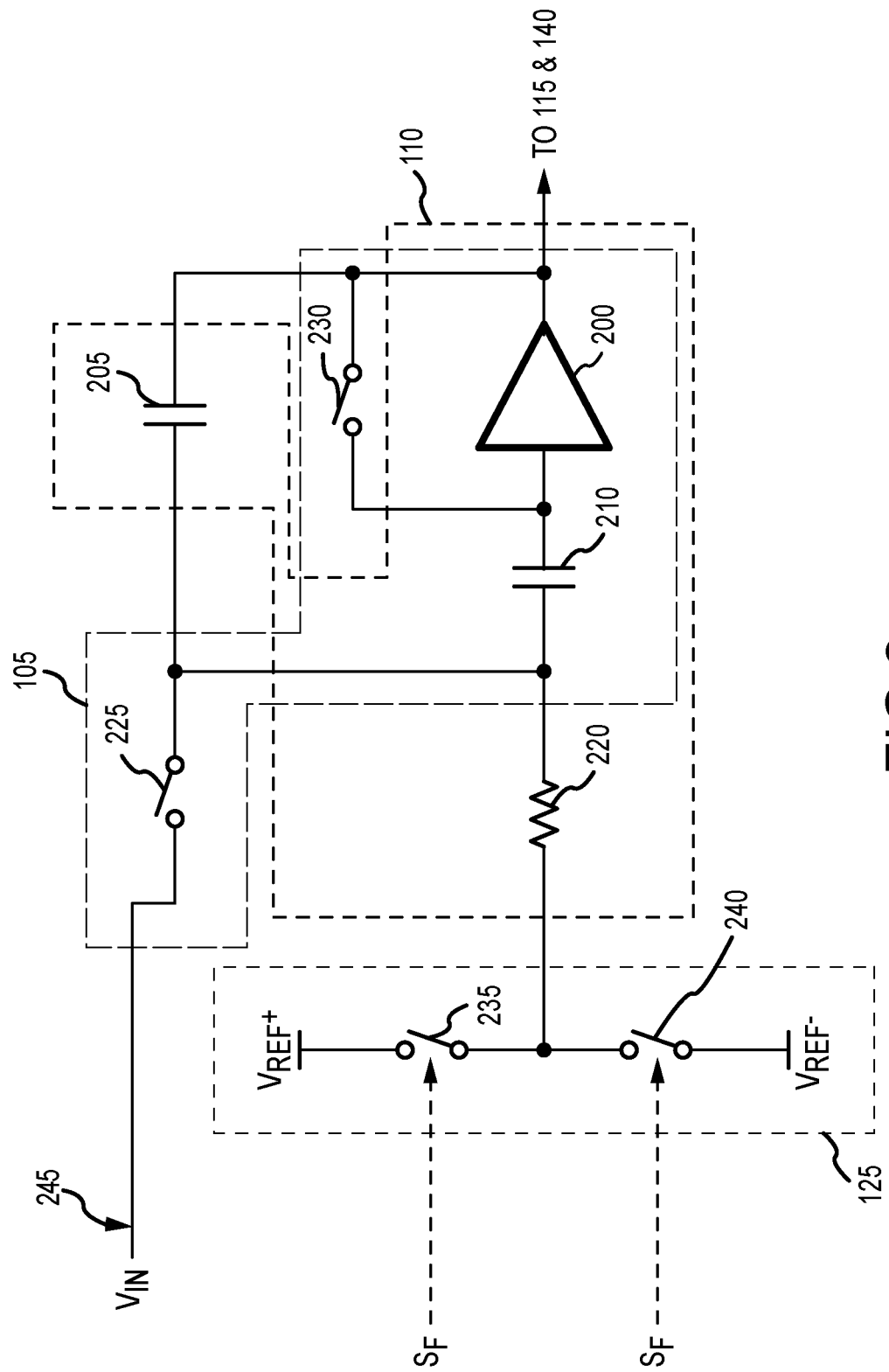
FIG. 2 is a partial circuit diagram of the incremental delta-sigma ADC in a hold mode and in accordance with an exemplary embodiment of the present technology.

Referring to FIGS. 1 and 2, the first integrator 110 may be configured to perform an adding function (represented by an adder 130) and a first integration function (represented by a first integrator circuit 145). For example, the integrator 110 may sum an output voltage from the second signal converter 125 and a voltage of the first capacitor 210.

In an exemplary embodiment, the first integrator 110 may comprise a first resistor 220, the first capacitor 210, a second capacitor 205, and the amplifier 200. As such, the sample-and-hold circuit 105 and the first integrator 110 share the first capacitor 210 and the amplifier 200—in other words, both the amplifier 200 and the first capacitor 210 are used during the sample-and-hold function performed by the sample-and-hold circuit 105 as well as during the integration function performed by the integrator 110.

The resistor 220 may be connected between the second signal converter 125 and the first plate of the first capacitor 210. In other words, the resistor 220 may be connected in series with the first capacitor 210. In addition, the resistor 220 may be connected to the first switch 225. The resistor 220 may comprise any suitable resistive element.

The second capacitor 205 may comprise a first plate and a second plate. The second capacitor 205 may be connected to the first switch 225, wherein in the first plate of the second capacitor 205 is connected to the first switch 225 and the second plate is connected to the output terminal of the amplifier 200. In other words, the second capacitor 205 is directly connected between the first switch 225 and an output terminal of the amplifier 200.

The second integrator 115 may be connected to the output terminal of the amplifier 200 and may be configured to perform a second integration function on an output signal of the amplifier 200. The second integrator 115 may comprise any circuit and/or system suitable for performing integration, such as the elements included in the first integrator 110, as described above.

The second integrator 115 may generate and transmit a second integrator output signal to a second adder 135. The second adder 135 may perform an addition function on the second integrator output signal and an output signal of the buffer 140.

The first signal converter 120 may be configured to convert an analog signal, such as a signal (voltage) generated by the second adder 135, to the digital output signal $V_{OUT}$. In an exemplary embodiment, the first signal converter 120 may comprise any suitable quantizer circuit.

The second signal converter 125 may provide a feedback loop from an output terminal of the first signal converter 120 to the first integrator 110. As such, the second signal converter 125 may receive the digital output signal $V_{OUT}$ as a feedback signal $S_F$. The feedback signal $S_F$ may be used to control the output signal (voltage) of the second signal converter 125. According to an exemplary embodiment, the second signal converter 125 may comprise a digital-to-analog converter and generate an analog signal to be used by the first integrator 110. For example, the output voltage from the second signal converter 125 may be added to the voltage of the first capacitor 210.

Figure 4:
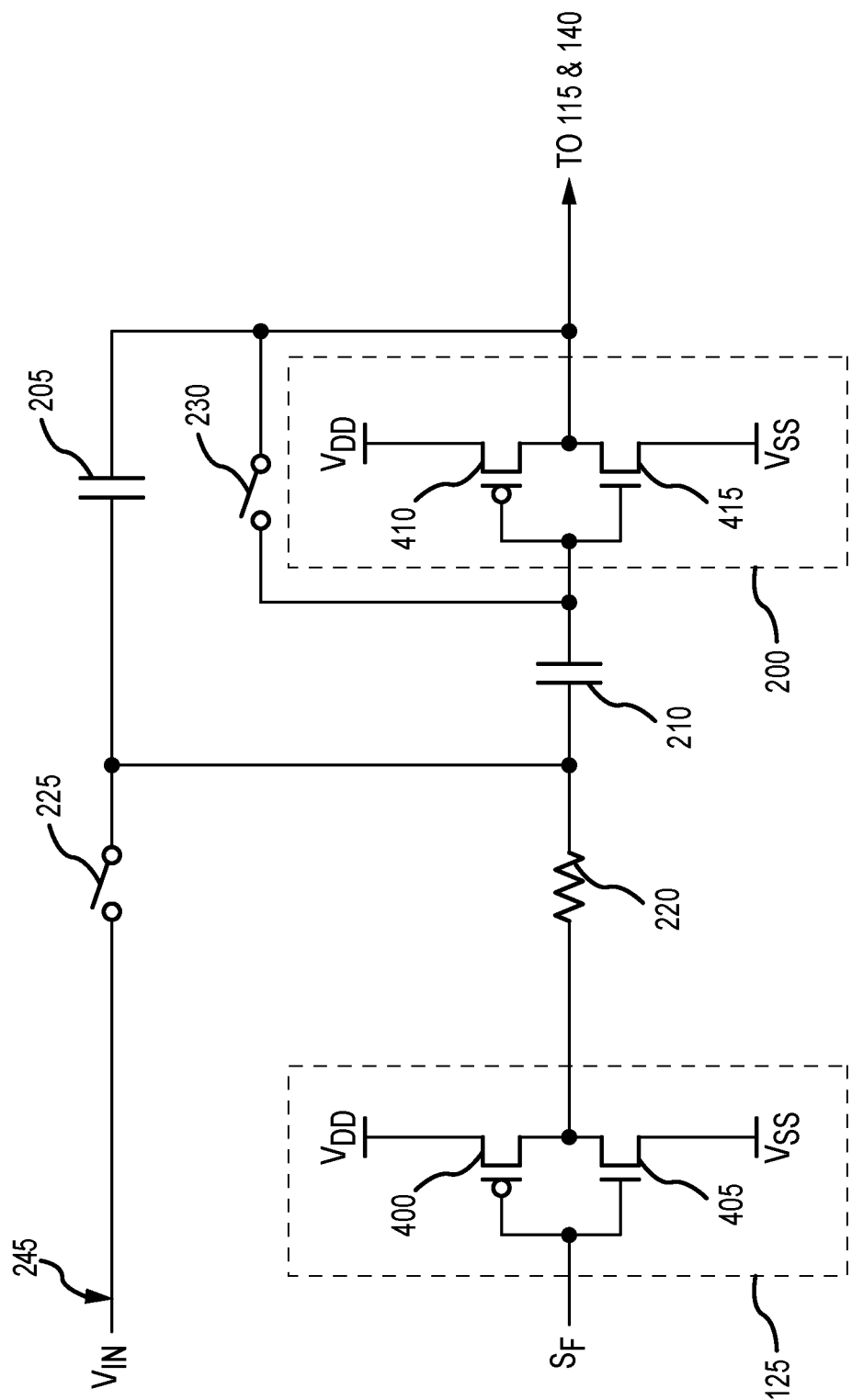
FIG. 4 is a partial circuit diagram of the incremental delta-sigma ADC in accordance with various embodiments of the present technology.

In one embodiment, and referring to FIG. 4, the second signal converter 125 may comprise a PMOS transistor 400 connected in series with an NMOS transistor 405, wherein gates of each transistor is connected to the feedback signal $S_F$, and a source terminal of the PMOS transistor 400 is connected to the supply voltage $V_{DD}$. A source terminal of the NMOS transistor 405 may be connected to the reference voltage $V_{SS}$. In the present case, a node between the PMOS transistor 400 and NMOS transistor 405 provides the output terminal of the second signal converter 125.

Figure 3:
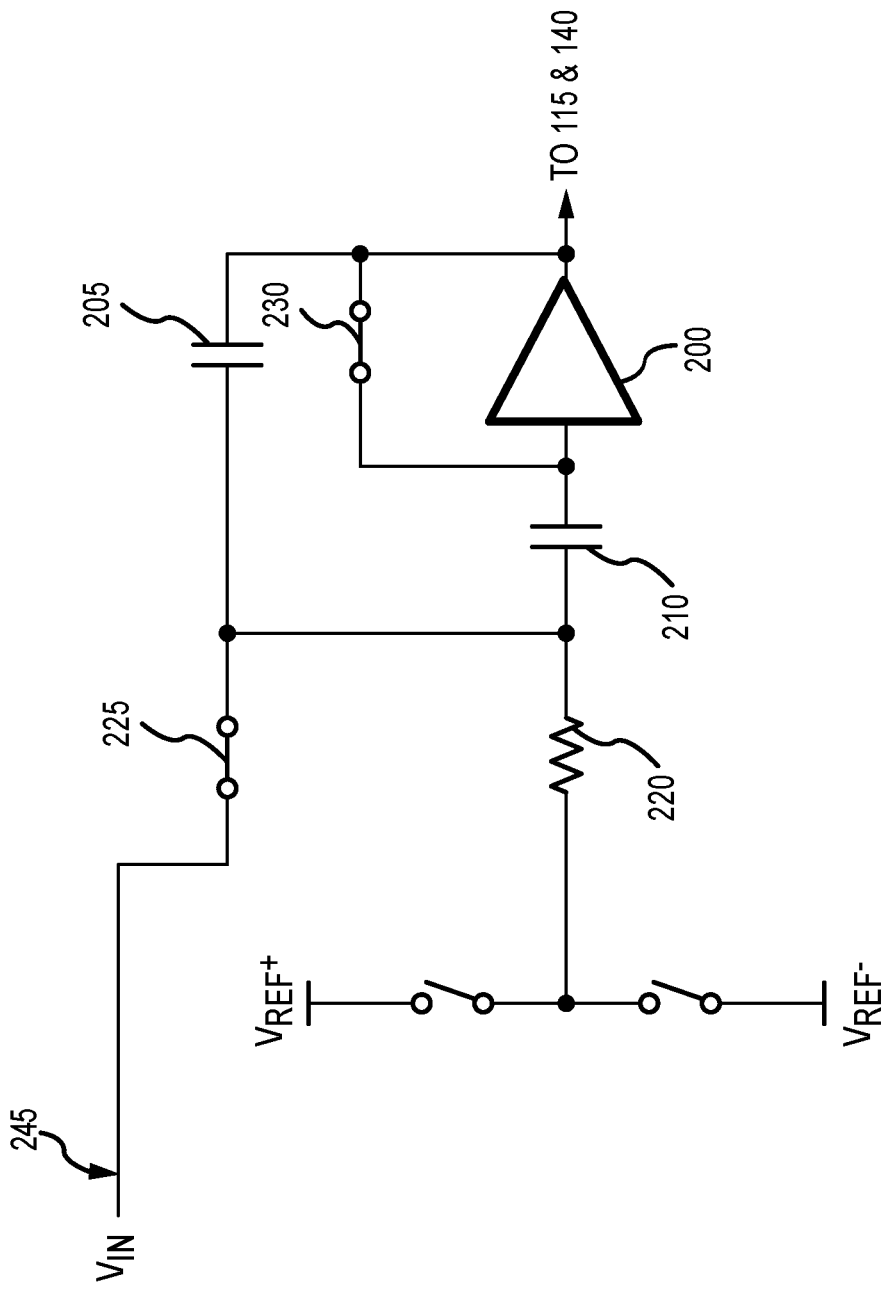
FIG. 3 is the partial circuit diagram of the incremental delta-sigma ADC in a sample mode and in accordance with an exemplary embodiment of the present technology.

In operation, the delta-sigma ADC 100 may perform a sample-and hold function and an integration function in sequence. For example, and referring to FIGS. 2 and 3, during the sample-and hold function, the first switch 225 and the second switch 230 are closed (ON). While the first and second switches 225, 230 are closed, the first capacitor 210 charges according to the voltage of the input signal $V_{IN}$. After the first capacitor 210 is charged, the first and second switches 225, 230 are opened (OFF) to hold the charge of the first capacitor 210. In addition, the input terminal of the amplifier 200 provides a high impedance so that the charge is held in the first capacitor 210.

The integrator 110 may sum an output voltage from the second signal converter 125 and the voltage of the first capacitor 210 (i.e., a summed voltage).

During integration, the amplifier 200, the first capacitor 210, the second capacitor 205, and the resistor 220 operate together as an op-amp integrator circuit that generates an output voltage that is proportional to the integral of the summed voltage.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An incremental delta-sigma analog-to-digital converter (ADC), comprising:
 a sample-and-hold circuit comprising a first switch, a second switch, a first capacitor, and an amplifier; and
 an integrator comprising the first capacitor, a second capacitor, and the amplifier;
 wherein the sample-and-hold circuit and the integrator share the first capacitor and the amplifier.

2. The incremental delta-sigma ADC according to claim 1, further comprising a digital-to-analog converter connected to the integrator.

3. The incremental delta-sigma ADC according to claim 1, wherein the first capacitor is directly connected between the first switch and an input terminal of the amplifier.

4. The incremental delta-sigma ADC according to claim 1, wherein the second switch is directly connected to the first capacitor and an output terminal of the amplifier.

5. The incremental delta-sigma ADC according to claim 1, wherein the second capacitor is directly connected between the first switch and an output terminal of the amplifier.

6. The incremental delta-sigma ADC according to claim 1, wherein the integrator further comprises a resistor:
 directly connected in series with the first capacitor and directly connected to the first switch.

7. The incremental delta-sigma ADC according to claim 1, wherein the first switch is connected in series with the second capacitor.

8. The incremental delta-sigma ADC according to claim 1, wherein the first capacitor is connected in series with the amplifier.

9. The incremental delta-sigma ADC according to claim 1, wherein the second switch is connected in parallel with the amplifier.

10. A method for operating on an input signal with a delta-sigma analog-to-digital converter (ADC), wherein the input signal has a voltage, comprising:
 sampling the input signal comprising closing a first switch and a second switch;
 charging a first capacitor to the voltage of the input signal;
 holding the charge of the first capacitor comprising:
  opening the first switch and second switch; and
  applying a high impedance to the first capacitor using an amplifier; and
 summing an output voltage from a signal converter and the voltage of the first capacitor;
 integrating the summed voltage using a second capacitor in parallel with the amplifier.

11. The method according to claim 10, wherein the first capacitor is connected directly between the first switch and an input terminal of the amplifier.

12. The method according to claim 10, wherein the second switch is connected in parallel with the amplifier.

13. The method according to claim 10, wherein the first switch is connected in series with the second capacitor.

14. A system configured to receive an input signal having a voltage, comprising:
 a sample-and-hold circuit comprising a first switch, a second switch, a first capacitor, and an amplifier, and configured to:
  receive the input signal;
  sample the input signal comprising operating the first switch and the second switch;
  charge the first capacitor to the voltage of the input signal;
  hold the charge of the first capacitor comprising:
   operating the first switch and second switch; and
   applying a high impedance to the first capacitor using the amplifier; and
 a first integrator comprising the first capacitor, a second capacitor, and the amplifier, and configured to integrate a summed voltage using the second capacitor and the amplifier, wherein the summed voltage is a sum of an output voltage of a digital-to-analog converter and the voltage of the first capacitor;
 wherein the sample-and-hold circuit and the first integrator share the first capacitor and the amplifier.

15. The system according to claim 14, wherein the first capacitor is directly connected between the first switch and an input terminal of the amplifier.

16. The system according to claim 14, wherein the second switch is:
 directly connected to the first capacitor and an output terminal of the amplifier; and is connected in parallel with the amplifier.

17. The system according to claim 14, wherein the first switch is connected in series with the second capacitor.

18. The system according to claim 14, wherein the second capacitor is directly connected between the first switch and an output terminal of the amplifier.

19. The system according to claim 14, wherein the amplifier comprises a p-channel transistor connected in series with an n-channel transistor.

20. The system according to claim 14, further comprising a second integrator connected to an output terminal of the first integrator.

* * * * *